(12) United States Patent
He et al.

(10) Patent No.: US 7,759,937 B2
(45) Date of Patent: Jul. 20, 2010

(54) METHOD AND APPARATUS FOR REDUCING ALIASING ARTIFACTS IN THE IMAGING FOR MR-MONITORED HIFU THERAPY

(75) Inventors: Zeng He He, Shenzhen (CN); Hai Ning Wang, Shenzhen (CN); Jian Min Wang, Shenzhen (CN); Yang Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 131 days.

(21) Appl. No.: 12/056,593

(22) Filed: Mar. 27, 2008

(65) Prior Publication Data

US 2008/0238426 A1   Oct. 2, 2008

(30) Foreign Application Priority Data

Mar. 29, 2007   (CN) .................. 2007 1 0064913

(51) Int. Cl.
   *G01V 3/00* (2006.01)
(52) U.S. Cl. ....................... 324/318; 600/411
(58) Field of Classification Search ................. 324/318, 324/322; 600/411
   See application file for complete search history.

(56) References Cited

U.S. PATENT DOCUMENTS 4,665,368 A * 5/1987 Sugiyama et al. ........... 324/318
6,501,978 B2 * 12/2002 Wagshul et al. ............. 600/411
6,516,211 B1 * 2/2003 Acker et al. ................. 600/411
7,463,030 B2 * 12/2008 He et al. ...................... 324/318

* cited by examiner

*Primary Examiner*—Louis M Arana
(74) *Attorney, Agent, or Firm*—Schiff Hardin LLP

(57) ABSTRACT

In a method and magnetic resonance (MR apparatus for reducing aliasing artifacts in the imaging for MR-monitored high intensity focused ultrasound HIFU therapy, a primary coil is used to receive the MR signals, and an additional coil is provided to receive interfering MR signals that form aliasing artifacts in the MR-monitored HIFU therapy imaging. The MR signals received by the primary coil and the interfering MR signals received by the additional coil are concurrently acquired. The interfering MR signals received by the additional coil are removed from the MR signals received by the primary coil. MR images are generated based on the MR signals with the interfering MR signals removed. Aliasing artifacts caused by the interfering MR signals thus are removed from the MR images without reducing the resolution of the scanned body parts in the MR images. In addition, the MR scanning time can be—maintained by using a proper phase oversampling technology in the concurrent signal acquisition.

8 Claims, 3 Drawing Sheets

METHOD AND APPARATUS FOR REDUCING ALIASING ARTIFACTS IN THE IMAGING FOR MR-MONITORED HIFU THERAPY

BACKGROUND OF THE INVENTION

1. Field of the Invention

The present invention involves a magnetic resonance imaging (MRI) technology. More particularly, it involves a method and a corresponding apparatus for reducing aliasing artifacts in the imaging for MR-monitored HIFU therapy.

2. Description of the Prior Art

In a magnetic resonance (MR) monitored high intensity focused ultrasound (HIFU) therapy system, the HIFU transducer, i.e. HIFU therapy head, emits a focused ultrasonic wave into the treated body through therapy water to increase the local temperature of the treated body part in a patient, thereby achieving the desired therapeutic result. FIG. 1 is a schematic diagram of an MR-monitored HIFU therapy system. As shown in FIG. 1, body 1 is lying on a bed 3, the primary coil 2 receives the MR signals from the body while the HIFU therapy head 5 is in the therapy water 4 and sends a focused ultrasonic wave to body 1 through the therapy water 4.

In practice, however, both the therapy head 5 for generating the ultrasonic waves and the therapy water 4 for conducting the ultrasonic wave to the body can also generate MR signals, which could add to the images to produce aliasing artifacts.

At present, several methods have been proposed for reducing the aliasing artifacts in MRI and one of these is to use an alternative liquid to replace water for conducting the ultrasonic wave to the body. However, water has so far proved to be the best liquid for transmitting ultrasonic signals and use of an alternative liquid will reduce the transmission rate of the ultrasonic wave, resulting in less satisfactory therapeutic results. Another proposal is to add a chemical agent to the water to prevent it from producing the MR signals; however such a chemical agent is often harmful to the human body, posing a greater risk to the patients. Currently, a more feasible method is to add a field of view (FOV) to include all water and therapy head in the imaging area, but this will inevitably increase the imaging time or reduce the image resolution of the area of interest (which is often a body part of the patients).

SUMMARY OF THE INVENTION

An object of the present invention is to provide a method for reducing aliasing artifacts in the imaging for MR-monitored HIFU therapy to reduce the aliasing artifacts in the MRI images without reducing the resolution of the area of interest in the MR images.

An object of the present invention is also to provide a corresponding apparatus for use in the above method for reducing aliasing artifacts in the MR-monitored HIFU therapy imaging.

These objects are achieved in accordance with the invention by a method for reducing aliasing artifacts in the imaging for MR-monitored HIFU therapy wherein a primary coil is used to receive MR signals and that includes the steps of providing an additional coil to receive the interfering MR signals which form the aliasing artifacts in the MR-monitored HIFU therapy imaging, concurrently acquiring the MR signal received by the primary coil and the interfering MR signals received by the additional coil, removing the interfering MR signals received by the additional coil from the MR signals received by the primary coil, and generating MR images based on the MR signals with the interfering MR signals removed.

The interfering MR signals are the MR signals generated by the HIFU therapy water and/or the HIFU therapy head.

The primary coil is disposed at a location close to the imaged object, and the additional coil is disposed at a location away from the imaged object.

Phase oversampling can be performed during the concurrent acquisition of the MR signals received by the primary coil and the interfering MR signals received by the additional coil.

The above objects, also are achieved in accordance with the present invention by an apparatus for reducing aliasing artifacts in the MR-monitored HIFU therapy imaging, having a primary coil for receiving MR signals and an additional coil for receiving the interfering MR signals forming aliasing artifacts in the MR-monitored HIFU therapy imaging, a control unit for controlling the primary coil and the additional coil to concurrently acquire signals, a signal processing unit for obtaining the MR signals received by the primary coil and the interfering MR signals received by the additional coil and for removing the interfering MR signals received by the additional coil from the MR signals received by the primary coil, and for generating MR images based on the MR signals with the interfering MR signals removed.

The signal processing unit cam include an interfering signal removing module for obtaining the MR signals received by the primary coil and the interfering MR signals received by the additional coil and removing the interfering MR signals received by the additional coil from the MR signals received by said primary coil, and an image generating module for generating MR images based on the MR signals with the interfering MR signals removed.

The primary coil can be disposed at a location close to the imaged object, and the additional coil is then disposed at a location away from the imaged object.

By using the present invention in the MR-monitored HIFU therapy, the aliasing artifacts caused by the interfering MR signals can be removed from the MR images without reducing the resolution of the scanned body part in the MR images with the use of an additional coil for receiving the interfering MR signals and the application of the concurrent collecting technology. Furthermore, the MR scanning time will not be increased as a result of the use of a proper phase oversampling method in the concurrent collection. In addition, the solution of the present invention poses no harm to the body and does not affect the HIFU therapeutic results, indicating a higher feasibility.

DESCRIPTION OF THE PREFERRED EMBODIMENTS

In order to make the object, technical solution and benefits of the present invention more evident, the following will give a further explanation of the present invention in conjunction with drawings and embodiments. It should be understood that the specific embodiments described herein are only for explanation, and do not restrict the present invention.

In order to solve the problems of aliasing artifacts present in the MR images, the present invention provides an additional coil to an MR-monitored HIFU therapy system to receive the interfering MR signals which form the aliasing artifacts. The main use of this additional coil is to receive the interfering MR signals, to concurrently collect signals from both the primary coil and the additional coil, and to remove the interfering MR signals received by the additional coil from the MR signals received by the primary coil to obtain the MR signals of the body and to generate MR images which contain only the MR signals of the body.

The following describes the present invention in detail through a specific embodiment.

Figure 1:
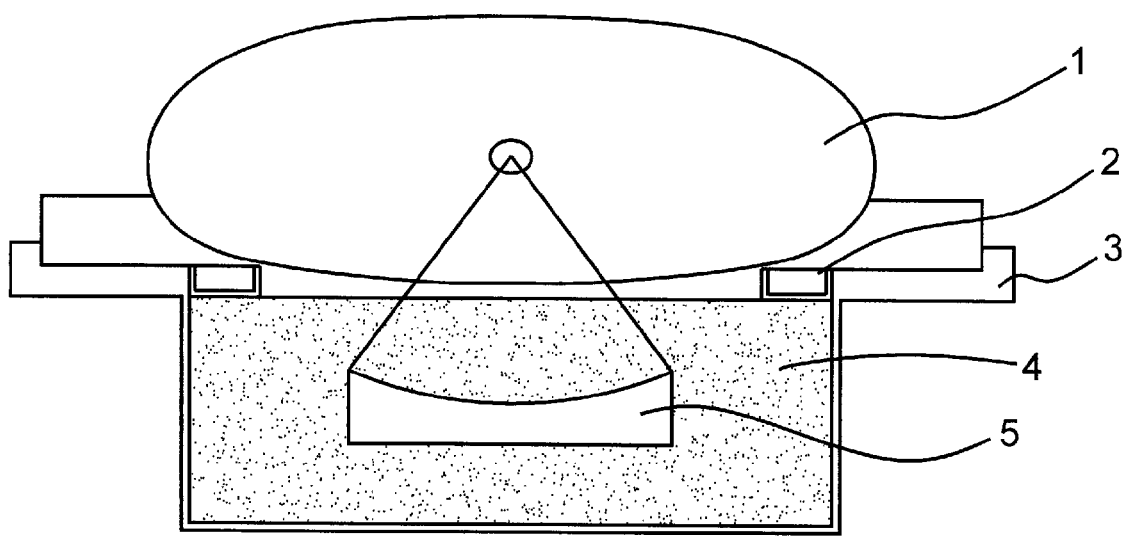
FIG. 1 is a schematic illustration of a prior art MR-monitored HIFU therapy system.
Figure 2:
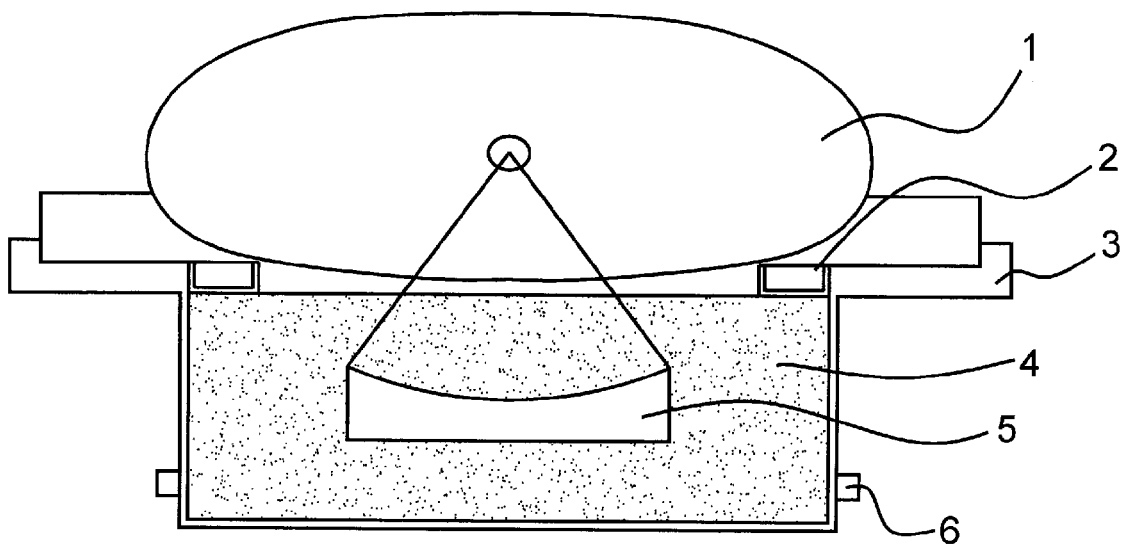
FIG. 2 is a schematic diagram of the MR-monitored HIFU therapy system according to the present invention.

FIG. 2 is a schematic illustration of an embodiment of the MR-monitored HIFU therapy system according to the present invention. In this embodiment, the interfering MR signals include the MR signals produced by therapy water and those produced by the therapy head moving in the therapy water. As shown in FIG. 2, in this embodiment, in addition to a primary coil 2 for receiving the MR signals from a body 1, a bed 3, therapy water 4 and a therapy head 5 located in the therapy water 4 for coupling the ultrasonic waves into the body 1, the MR-monitored HIFU therapy system has an additional coil 6 to receive the MR signals from both the therapy water 4 and the therapy head 5. This additional coil 6 is disposed at a location which is away from the body but close to both the therapy water 4 and therapy head 5, for example at the periphery of the bottom of the tank containing the therapy water 4.

The additional coil 6 is used to receive only the MR signals from the therapy water 4 and therapy head 5, and thus it does not require a high signal-to-noise ratio of the actual imaged area (the body), but has good sensitivity to both the therapy water 4 and therapy head 5.

Figure 3:
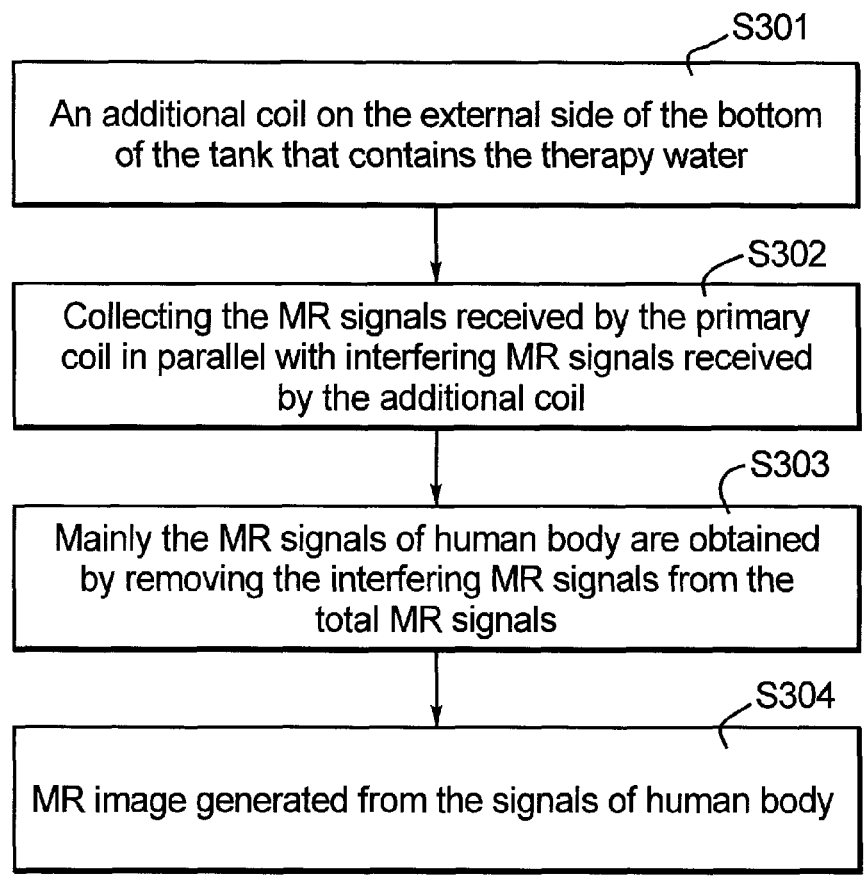
FIG. 3 is a flowchart showing the method for reducing aliasing artifacts in the MR-monitored HIFU therapy imaging according to the present invention.

FIG. 3 is a flowchart showing the method for reducing aliasing artifacts in the MR-monitored HIFU therapy imaging according to an embodiment of the present invention. As shown in FIG. 3, in this embodiment, the following steps are performed during the MR imaging of the body in the MR-monitored HIFU therapy:

Step S301: the primary coil 2 is provided and an additional coil 6 is disposed at the periphery of the bottom of the tank containing the therapy water.

The primary coil 2 not only can receive the MR signals of the body, but also can receive the MR signals of the therapy water 4 and the therapy head 5. The additional coil 6 is mainly used to receive the MR signals of the therapy water 4 and the therapy head 5. Therefore, preferably the additional coil 6 is larger than the primary coil 2 so that it can better receive the MR signals of the therapy water 4 and the therapy head 5 which are closer to the additional coil 6, but receives virtually no MR signals of body 1.

Step S302: the MR signals received by the primary coil 2 are collected in concurrence with the interfering MR signals received by the additional coil 6. The MR signals received by the primary coil 2 are the total MR signals, which include not only the MR signals of the body 1, but also the MR signals of the therapy water 4 and-the therapy head 5. The MR signals received by the additional coil 6 are the interfering MR signals and since the additional coil 6 is sensitive to the MR signals of the therapy water 4 and the therapy head 5, these interfering MR signals will mainly include the MR signals of the therapy water 4 and the therapy head 5.

A proper phase oversampling technology can be introduced into concurrent collection of the MR signals received by the primary coil 2 and the interfering MR signals received by the additional coil 6 so that the scanning time remains unchanged or becomes shorter. For instance, in this embodiment, with the parameter of the phase oversampling set to 63%, the scanning time is 13 seconds.

Step S303: removing the interfering MR signals from the total MR signals to obtain the MR signals that mainly contain the MR signals of the body.

Step S304: MR images mainly containing the MR signals of the body are generated.

Because the MR signals mainly contain the MR signals of the body, the resulting MR image will mainly reflect the MR signals of the body.

Figure 4:
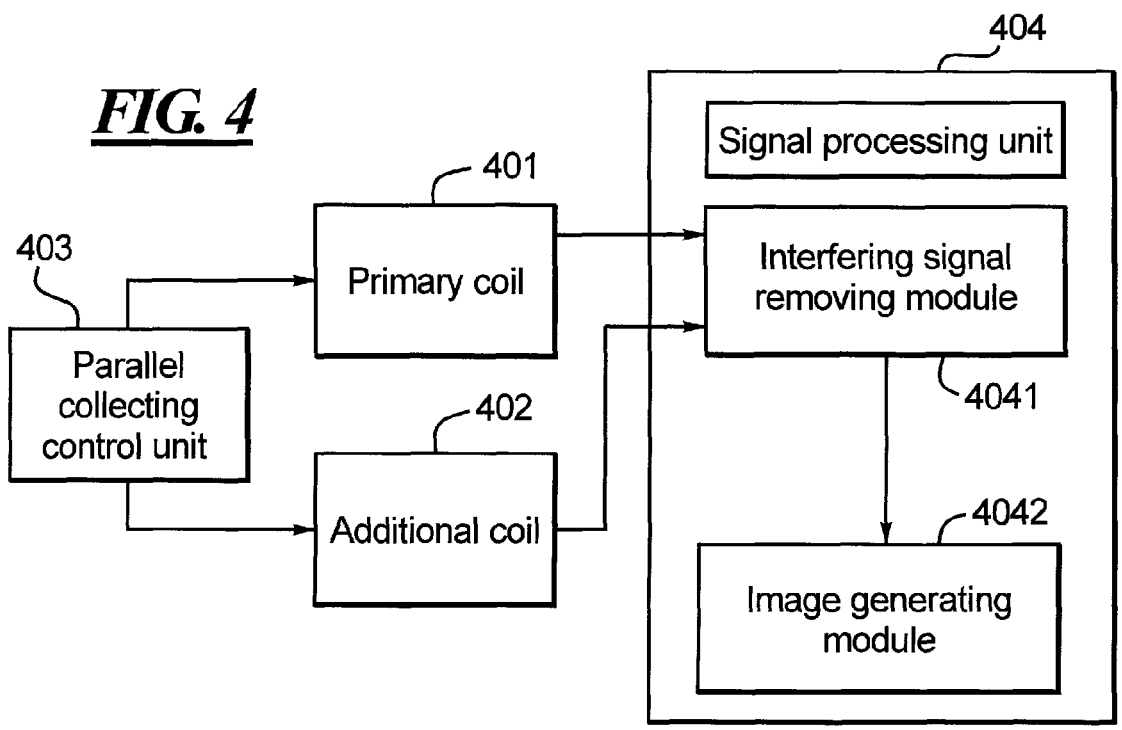
FIG. 4 is diagram showing the structure of the apparatus for reducing aliasing artifacts in the MR-monitored HIFU therapy imaging according to the present invention.

FIG. 4 is a chart illustrating the structure of an embodiment of the apparatus for reducing aliasing artifacts in the MR-monitored HIFU therapy imaging according to the present invention.

As shown in FIG. 4, in this embodiment, an apparatus for reducing aliasing artifacts in the MR-monitored HIFU therapy imaging has a primary coil 401, an additional coil 402, a control unit 403 and a signal processing unit 404.

The primary coil 401 receives the total MR signals including the MR signals of the body and the interfering MR signals. The additional coil 402 mainly receives the interfering MR signals.

The control unit 403 controls the primary coil 401 and additional coil 402 to concurrently acquire signals.

The signal processing unit 404 acquires the total MR signals received by the primary coil 401 and the interfering signals received by the additional coil 402, removes the interfering MR signals from the total MR signals to obtain the MR signals of the body, and generates MR images from the signals of the body. The signal processing unit 404 comprises an interfering signal removing module 4041 and an image generating module 4042. Wherein, the interfering signal removing module 4041 acquires the total MR signals received by the primary coil 401 and the interfering signals received by the additional coil 402, and removes the interfering MR signals from the total MR signals to obtain the MR signals of the body, while the image generating module 4042 generates MR images from the signals of the body.

The control unit 403 further uses a phase oversampling technology in the process of controlling concurrent signal collection of the primary coil 401 and additional coil 402.

Figure 5:
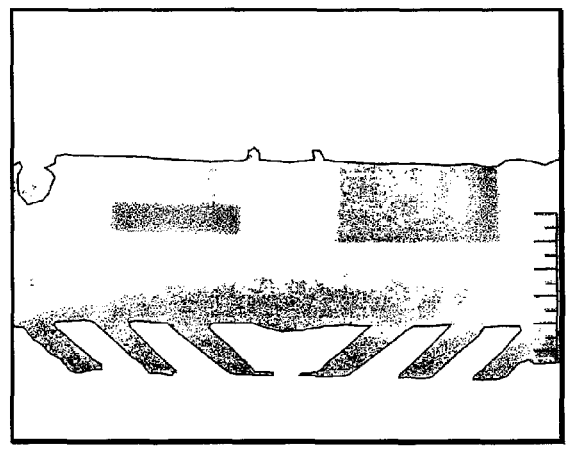
FIG. 5 is an MR image containing aliasing artifacts caused by the therapy head and water during the MR-monitored HIFU therapy.

FIG. 5 is an MR image generated without the additional coil during the MR-monitored HIFU therapy. In the instance shown in FIG. 5, FOV is 200 without concurrent collection and phase oversampling and the scanning time is 14 seconds. It can be seen from FIG. 5 that there are noticeable aliasing artifacts in the upper part of the MR image.

Figure 6:
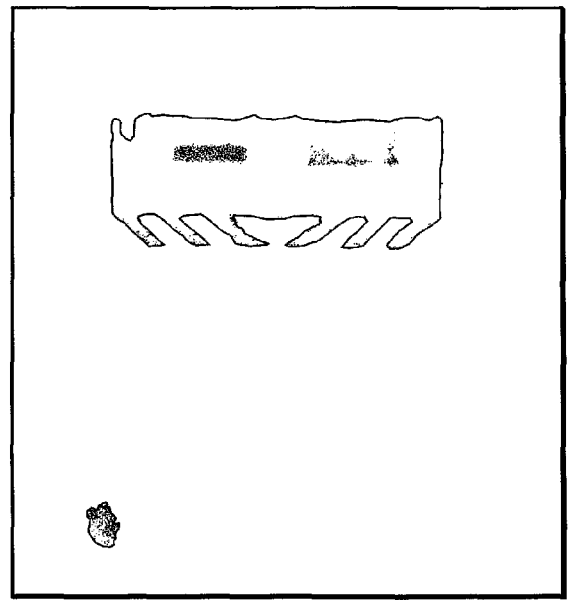
FIG. 6 is an MR image with a magnified FOV during the MR-monitored HIFU therapy.

FIG. 6 is an MR image with the magnified FOV during the MR-monitored HIFU therapy. In the instance shown in FIG. 6, FOV is 500 and contains the therapy water and therapy head, and the scanning time is 14 seconds. We can see from FIG. 6 that the imaged area shown contains the therapy water and therapy head, but the resolution of the body part is very low.

Figure 7:
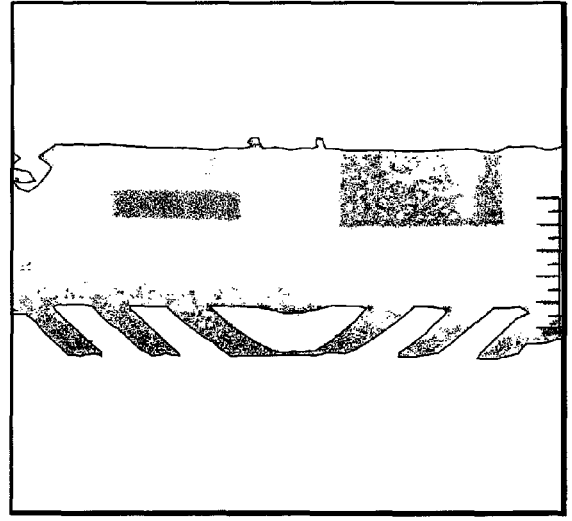
FIG. 7 is an MR image generated by using the technical solution of the present invention during the MR-monitored HIFU therapy.

FIG. 7 is an MR image generated using the solution of the present invention during the MR-monitored HIFU therapy. In the instance shown in FIG. 7, FOV is still 200 but the concurrent collection is used and phase oversampling is set to 63% and the scanning time is 13 seconds. To be seen from the FIG. 7 that the aliasing artifacts in the MR image are basically eliminated. This indicates that by using the technical solution of the present invention, the aliasing artifacts caused by the interfering MR signals can be removed from the MR images without reducing the resolution of the body part in the MR images with the use of an additional coil to receive the interfering MR signals in the MR-monitored HIFU therapy. In addition, the MR scanning time could be maintained with the use of a proper phase oversampling in the concurrent collection.

It should be noted that because the therapy head may not necessarily generate MR signals, the aliasing artifacts may be generated only by the therapy water, in which case, the solution for reducing the aliasing artifacts is the same as the solution described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for reducing aliasing artifacts during magnetic resonance (MR) imaging for MR-monitored high intensity focused ultrasound (HIFU) therapy, comprising the steps of:

in an MR apparatus, implementing MR-monitored HIFU therapy on a subject in the MR apparatus using HIFU therapy components that are excited by excitation signals used to generate diagnostic magnetic resonance signals from the subject, and thereby emit interfering signals that produce aliasing artifacts in an MR image generated during HIFU therapy;

with a primary coil of said MR apparatus, receiving that diagnostic magnetic resonance signals from a subject during operation of said HIFU therapy components in said MR-monitored HIFU therapy in said MR apparatus, said primary coil also receiving said interfering signals;

providing an additional coil in said MR apparatus that receives only said interfering MR signals that originate from said HIFU therapy components acquiring said diagnostic MR signals and said interfering signals with said primary coil concurrently with acquiring said interfering MR signals with said additional coil;

automatically electronically removing the interfering MR signals received by the additional coil from the diagnostic MR signals received by the primary coil; and executing an imaging algorithm and generating an MR image from the diagnostic MR signals with the interfering MR signals removed therefrom.

2. A method as claimed in claim 1 comprising receiving signals with said additional coil that originate from at least one of therapy water and a HIFU therapy head used in said HIFU therapy.

3. A method as claimed in claim 1 comprising locating said primary coil at a position close to said subject and locating said additional coil farther away from said subject.

4. A method as claimed in claim 1 comprising performing phase oversampling of the concurrently acquired diagnostic MR signals and the interfering MR signals.

5. A magnetic resonance (MR) apparatus for reducing aliasing artifacts during magnetic resonance (MR) imaging of MR-monitored high intensity focused ultrasound (HIFU) therapy, comprising:

a magnetic resonance data acquisition unit having HIFU therapy components therein;

a control unit that operates said magnetic resonance data acquisition unit to implement MR-monitored HIFU therapy on a subject in the MR data acquisition unit, said HIFU therapy components being excited by excitation signals used to generate MR diagnostic signals from the subject during said MR-monitored HIFU therapy, and thereby generating interfering signals that produce aliasing artifacts in an MR image obtained during said MR monitored HIFU therapy;

a primary coil that receives diagnostic magnetic resonance signals, interfered by said interference signals, from a subject during MR-monitored HIFU therapy;

an additional coil that receives only said interfering MR signals that originate from said HIFU therapy components;

a processor that operates said primary coil and said additional coil concurrently to acquire, with said primary coil, said diagnostic MR signals interfered with said interfering signals, and, with said additional coil, said interfering MR signals and that automatically removes the interfering MR signals received by the additional coil from the diagnostic MR signals interfered with said interfering signals received by the primary coil, and that executes an imaging algorithm to generate an MR image from the diagnostic MR signals with the interfering MR signals removed therefrom.

6. An apparatus as claimed in claim 5 wherein said additional coil is configured and operated to receive signals with said additional coil that originate from at least one of therapy water and a HIFU therapy head used in said HIFU therapy.

7. An apparatus as claimed in claim 5 wherein said primary coil is located at a position close to said subject and said additional coil is located farther away from said subject.

8. An apparatus as claimed in claim 5 wherein said processor performs phase oversampling of the concurrently acquired diagnostic MR signals and the interfering MR signals.

* * * * *